United States Patent [19]

Moles

[11] Patent Number: 5,065,041

[45] Date of Patent: Nov. 12, 1991

[54] TIMING GENERATOR MODULE

[75] Inventor: Robert G. H. Moles, Sudbury, Mass.

[73] Assignee: Bull HN Information Systems Inc., Billerica, Mass.

[21] Appl. No.: 293,714

[22] Filed: Jan. 5, 1989

[51] Int. Cl.$^5$ .................. H03K 5/13; H03K 5/159; H03K 7/00; G11C 7/00
[52] U.S. Cl. .................. 307/269; 307/595; 307/606; 328/55; 328/63; 328/72; 365/194
[58] Field of Search .............. 307/269, 480, 511, 265, 307/606, 595; 328/58, 63, 55, 72, 110; 365/194

[56] References Cited

U.S. PATENT DOCUMENTS

| | | | |
|---|---|---|---|
| 3,386,036 | 5/1968 | Gerrard et al. | 307/606 |
| 3,418,498 | 12/1968 | Farley | 307/480 |
| 3,947,672 | 3/1976 | Harrison et al. | 328/110 |
| 4,134,073 | 1/1979 | MacGregor | 307/606 |
| 4,241,418 | 12/1980 | Stanley | 328/63 |
| 4,320,525 | 3/1982 | Woodward | 307/480 |
| 4,414,637 | 11/1983 | Stanley | 307/595 |
| 4,641,048 | 2/1987 | Pollock et al. | 307/595 |
| 4,859,954 | 8/1989 | Yoshimura | 307/606 |

FOREIGN PATENT DOCUMENTS

| | | | |
|---|---|---|---|
| 0230156 | 10/1958 | Australia | 365/194 |
| 0056256 | 10/1969 | Fed. Rep. of Germany | 307/265 |
| 1495229 | 9/1967 | France | 307/606 |

*Primary Examiner*—John S. Heyman
*Assistant Examiner*—Trong Phan
*Attorney, Agent, or Firm*—Faith F. Driscoll; John S. Solakian

[57] ABSTRACT

A timing generator module is constructed from a single multitap active delay line circuit. The delay line taps are customized to delay an input pulse by different amounts, the differences between the amounts being selected as a function of the widths of the output pulses to be generated by the module. The output pulses from each of a number of different pairs of taps are logically combined within corresponding ones of a number of output logic gate circuits. A selected one of each pair of pulses is inverted before being logically combined with the other pulse of the pair for accurately controlling the transitions of the corresponding output pulse. The active delay line circuits are packaged within a single dual line package for maintaining accurate tolerances.

17 Claims, 3 Drawing Sheets

TIMING GENERATOR MODULE

RELATED PATENT APPLICATIONS

The patent application of David E. Cushing, Romeo Kharileh, Jian-Kuo Shen and Ming-Tzer Miu entitled, "Dual Port Read/Write Register File Memory," which issued as U.S. Pat. No. 4,933,909 on June 12, 1990 and which is assigned to the same assignee as this patent application.

The patent application of David E. Cushing, Richard P. Kelly, Robert V. Ledoux and Jian-Kuo Shen entitled, "Mechanism for Automatically Updating Multiple Unit Register File Memories in Successive Cycles for a Pipelined Processing System," which issued as U.S. Pat. No. 4,980,819 on Dec. 25, 1990 and which is assigned to the same assignee as this patent application.

BACKGROUND OF THE INVENTION

1. Field of Use

The present invention relates to timing generator circuits for use in data processing systems and more particularly to delay line timing generator circuits for controlling the operation of the various components of such data processing systems.

2. Prior Art

In data processing units, the operation of the different components which comprise such units are synchronized by clocking signals generated by a common clock generator. Since the performance of such units is dependent upon the timed sequences of clocking signals, it is important that such signals be highly reliable and stable.

To generate the required sequences of clocking signals, combinations of several multitap delay lines have been used which have the advantage of closer tolerances as compared to monostable multivibrator or one shot circuits. An example of this type of system is disclosed in U.S. Pat. No. 4,414,637.

While these types of systems provide reasonably accurate timing signals, the lack of timing correlation between the delay lines and between the delay lines and logic circuits produces timing tolerances which can limit the speed of performing certain operations. This is particularly true in those situations where several timed operations is required to be performed within a single cycle of operation. It has also been found that in certain instances, it is necessary to cascade inverter circuits to produce delays. This is wasteful in terms of both circuit area and power.

Accordingly, it is a primary of object of the present invention to provide a timing module which minimizes timing tolerances.

It is a further object of the present invention to provide a timing module which requires a minimum of components and space.

SUMMARY OF THE INVENTION

The above objects and advantages of the present invention are achieved in a preferred embodiment of the timing module of the present invention which is constructed from a single multitapped active delay line circuit. The delay line taps are customized to delay a pulse applied to the input of the delay line by different amounts, the differences between these amounts being selected as a function of the widths of the output pulses generated by the module.

The output pulses from each of a number of different pairs of taps are logically combined within corresponding ones of a number of output logic gate circuits. A selected one of each pair of pulses is inverted by the same type of logic gate circuit before being logically combined with the other pulse of that pair for accurately controlling the transitions of the corresponding output pulse and providing the desired pulse width.

The use of a single active delay line maximizes the correlation between the output pulses and minimizes relative timing tolerances. In one embodiment, the module utilizes the same type of logic gate circuits for providing the necessary driving power and logical combining of pulses. The active delay line and its associated logic gate circuits are packaged within a single DIP package. This compact packaging further ensures the minimization of variations in timing tolerances. Additionally, the packaging allows for the compensation of logic gate circuit timing tolerances by the adjustment of delay line taps at the time of manufacture thereby ensuring better absolute timing tolerances.

The novel features which are believed to be characteristic of the invention both as to its organization and method of operation, together with further objects and advantages, will be better understood from the following description when considered in connection with the accompanying drawings. It is to be expressly understood, however, that each of the drawings is given for the purpose of illustration only and is not intended as a definition of the limits of the present invention.

DESCRIPTION OF THE PREFERRED EMBODIMENT OF FIG. 1

Figure 1:
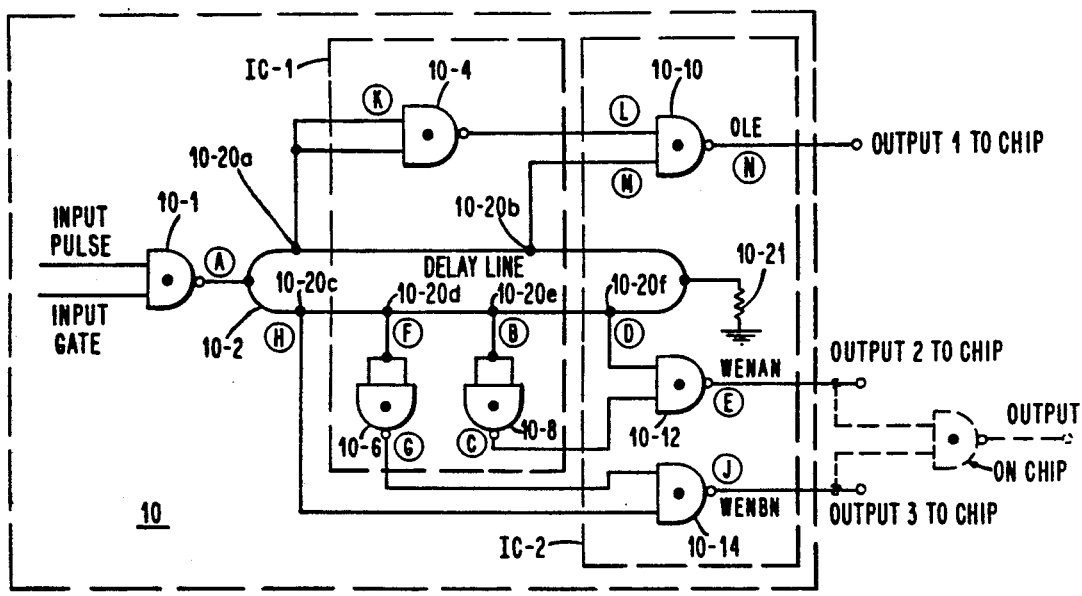
FIG. 1 is a circuit diagram of a preferred embodiment of the timing module of the present invention.

FIG. 1 shows a preferred embodiment of a timing module 10 constructed according to the teachings of the present invention. As shown, the module 10 is constructed from a multitap active delay line circuit also labeled 10. The active delay circuit 10 is formed by circuits 10-1 through 10-21. The passive delay line circuit 10-2 is terminated at one end by a resistor 10-21 having a value approximating the characteristic impedance of the delay line to eliminate reflections. An input pulse and input gate signal is applied to the other input end of the delay line circuit 10-2 through a NAND gate circuit 10-1. The output pulse appearing at a first tap 10-20a is inverted by a NAND gate circuit 10-4 and applied to one input of an output NAND gate circuit 10-10. The other input of the NAND gate circuit 10-10 is connected to receive an output pulse appearing at a second tap 10-20b.

NAND gate circuit 10-10 logically combines the pair of pulses at its inputs to produce an output pulse signal OLE at an output terminal 1. The first pair of taps 10-20a and 10-20b are positioned at points within the delay line 10-2 to provide delays which when combined within NAND gate 10-10 provide an output pulse whose width is defined by the difference between the selected amounts of delay for the first pair of taps.

One input of a NAND gate circuit 10-14 is connected to receive an output pulse appearing at a third tap 10-20c. The output pulse appearing at a fourth tap 10-20d is inverted by a NAND gate circuit 10-6 and applied to the other input of output NAND gate circuit 10-14. In a manner similar to that described above, NAND gate circuit 10-14 logically combines the pulses at its inputs to produce an output pulse WENBN at an output terminal 3 whose width is defined by the difference in the selected amounts of delay provided by a second pair of taps 10-20c and 10-20d.

In a similar manner, the pulses appearing at a fifth tap 10-20e and a sixth tap 10-20f are logically combined within a NAND gate 10-12 following the inversion of the pulse at fifth tap 10-20e by a NAND gate circuit 10-8. The NAND gate circuit 10-12 produces an output pulse WENAN at an output terminal 2 whose width is defined by the difference in the selected amounts of delay provided by a third pair of taps 10-20e and 10-20f.

In the embodiment of FIG. 1 the NAND gates are constructed from Advanced Schottky buffer/driver integrated circuits having part no. 74AS1000 manufactured by Texas Instruments Inc. As indicated in FIG. 1, for purposes of delay correlation, the NAND gate circuits 10-4, 10-6 and 10-8 are located on the same integrated circuit(IC-1). For the same reason, the NAND gate circuits 10-10, 10-12 and 10-14 are placed on the same integrated circuit(IC-2). The active delay line 10 is constructed in a conventional manner except for the inclusion of NAND gate circuits in place of the standard inverter circuits and the selection of delay taps as described above. The advantage of using an active delay line is that it can be treated as another integrated circuit within a data processing unit.

Figure 2:
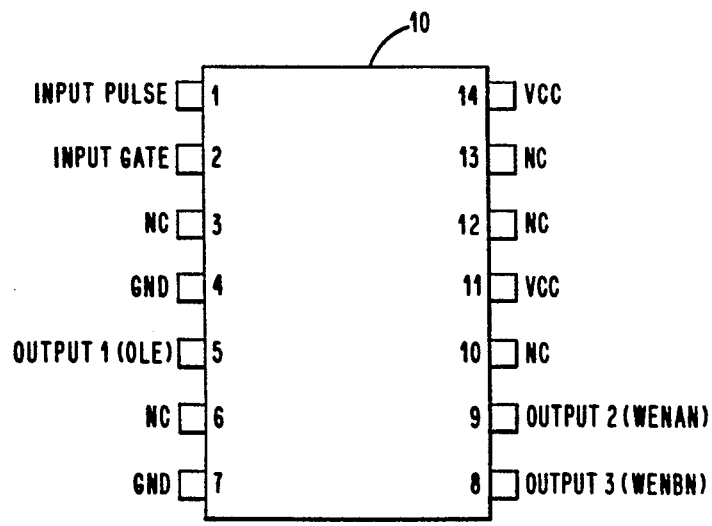
FIG. 2 illustrates the packaging of the timing module of the present invention.

The circuits of active delay line 10 are packaged in a single dual in line package (DIP). The package for module 10 is shown in FIG. 2.

DESCRIPTION OF OPERATION

With reference to the timing diagrams of FIGS. 3 and 4, the operation of the timing module 10 of FIG. 1 will now be described. Timing module 10 is used to generate a sequence of pulses which define when read and write operations are to be performed within a register file memory device during a system cycle of operation. The input pulse has a duration which corresponds to one-half of the system or CPU cycle of operation. The waveforms WENAN and WENBN are ored together by a NAND gate circuit included within the register file memory chip. The NAND gate circuit and resulting waveform are shown in dotted lines in FIGS. 1 and 3, respectively.

Accordingly, it is important that the sequence of pulses have certain relative relationships having close tolerances to ensure proper memory operation. For further information about register file memory operation, reference may be made to the listed related patent applications.

Figure 3:
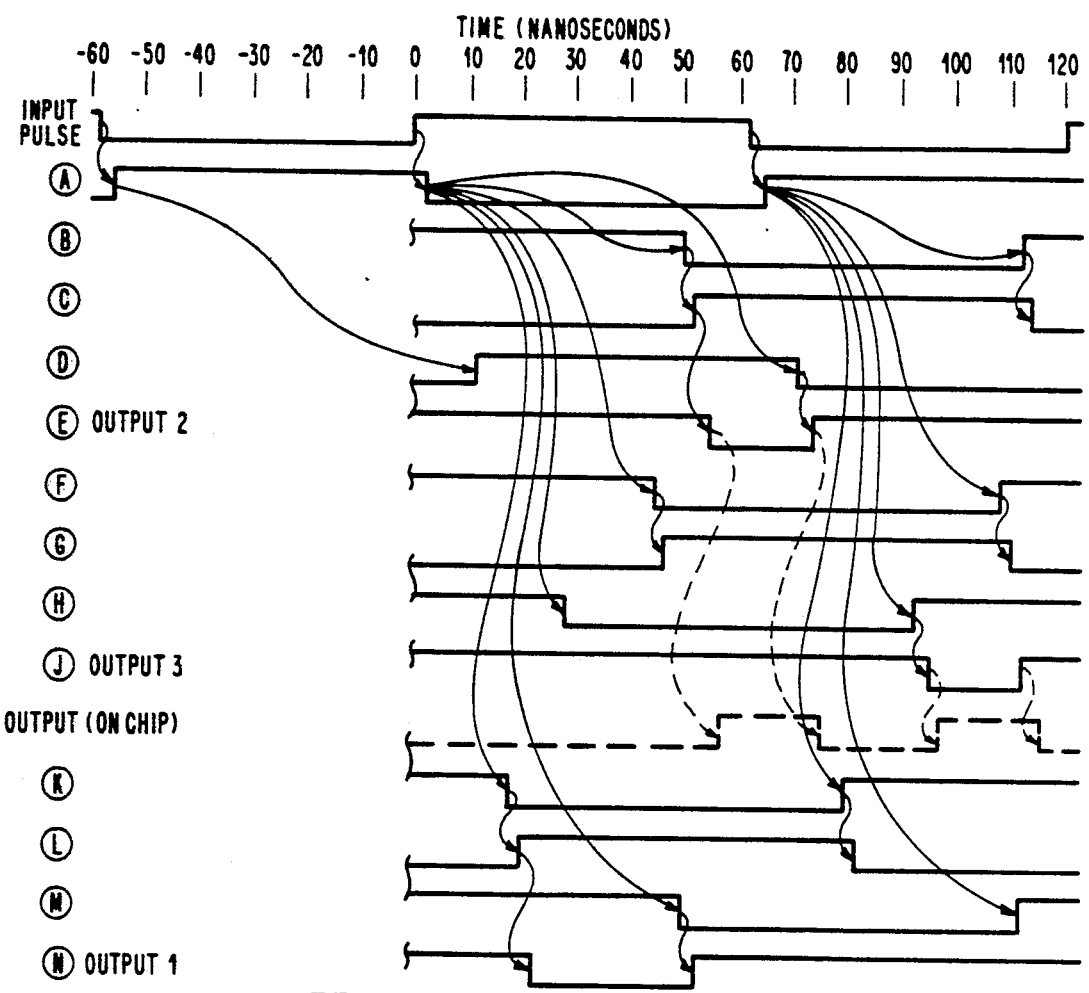
FIG. 3 is a timing diagram illustrating the generation of pulse sequences according to the present invention.
Figure 4:
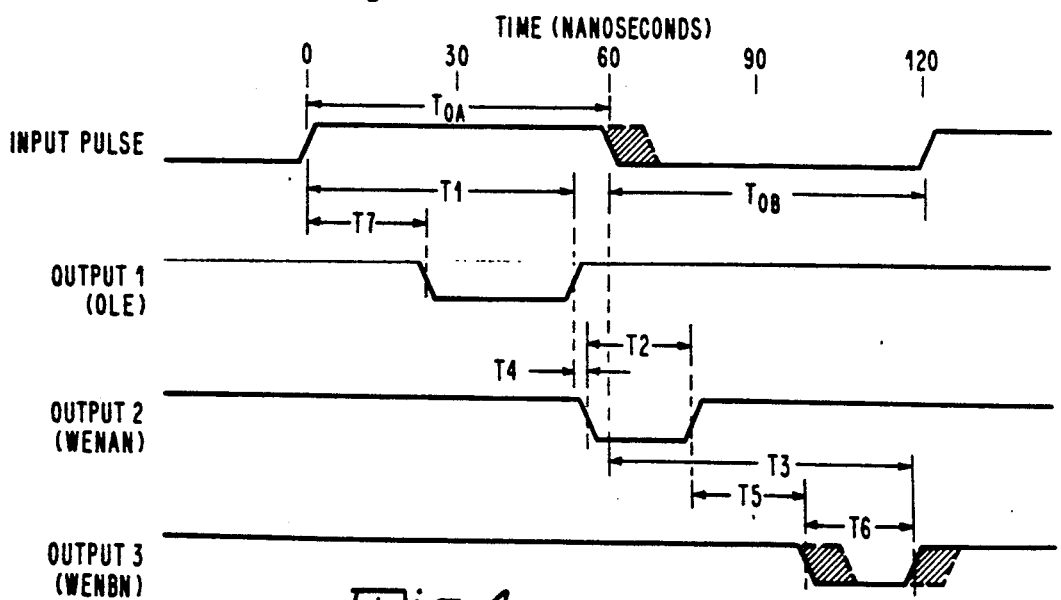
FIG. 4 is a timing diagram showing in greater detail, certain ones of the waveforms of FIG. 3.

Referring to FIG. 3, it is seen that the input pulse and gate signals applied to NAND gate circuit 10-1 produce waveform A which is applied to the input of the passive delay line circuit 10-2. This causes the generation of a sequence of pulses corresponding to waveforms K,M,H,F,B and D to appear at output taps 10-20a through 10-20f respectively. The waveforms are delayed by the amounts indicated in FIG. 3.

Waveforms K, F and B are inverted to produce waveforms L, G and C, respectively. These waveforms are in turn combined with waveforms M, H and D, respectively, to produce the waveforms OLE, WENAN and WENBN. It will be noted that the most critical timing relationships are arranged to be controlled by the same edge of the input pulse. These times are indicated in FIG. 4 and correspond to times T1 through T7. This eliminates the additional tolerance on the delays between successive input pulse edges.

In the preferred embodiment, times T1 through T7 have the following values and tolerances: $T1=52\pm3.6$ nanoseconds; $T2, T6=18\pm2.5$ nanoseconds; $T3=51\pm3.6$ nanoseconds; $T4=3\pm2.5$ nanoseconds; $T5=22\pm3$ nanoseconds and $T7=22\pm5$ nanoseconds. The tolerances for T1 through T7 are for an environmental range of voltage and temperature (i.e., 5 volts $\pm5\%$ and 10°–50° C.). The duration of intervals $T_{OA}$ and $T_{OB}$ in FIG. 4 are defined by the system cycle time. $T_{OA}$ and $T_{OB}$ have values which range from 59 to 70 nanoseconds (e.g., $T_{OA}=61$, $T_{OB}=59$).

Thus, the rising edge or positive going transition of waveform OLE and the falling edge or negative going transition of waveform WENAN and the pulse width of the negative going pulse waveform WENAN, are all controlled by the rising edge or positive going transition of the input pulse. Similarly, the pulse width of the negative going pulse waveform WENBN is controlled only by the falling edge or negative going transition of the input pulse.

In greater detail, the positive and negative going transitions of waveforms OLE and WENAN are controlled by the rising edge or positive going transition of the waveform A applied to the input of the delay line circuit 10-2. A first pulse at an appropriately timed first tap (e.g. 10-20a or 10-20e) of delay line circuit 10-2 is inverted and applied to a first input of one of the NAND gate circuits (10-10 or 10-12). The signal at this input rises after a controlled delay interval after the input pulse signal rises because of the inversion of waveform A by the input NAND driver circuit 10-1 followed by the inversion by one of the NAND gate circuits (e.g. 10-4 or 10-8).

The pulse signal from an appropriately timed later or second tap (e.g. 10-20b or 10-20f) is then directly applied to the other input of the NAND gate circuit. Since this signal is not inverted at the tap and because it is a later tap than the first tap, it is still in the high state when the pulse signal at the first input rises. Thus, at this instant of time both inputs of the NAND gate circuit are high causing the output waveform (e.g. OLE or WENAN) of the NAND gate circuit to fall. When the positive going transition reaches the later or second tap, the pulse signal at the second input of the NAND gate circuit falls causing the output waveform to rise.

The transitions of waveform WENBN are similarly controlled by the falling edge or negative going edge of the input waveform A. This is done by not inverting the pulse signal at the earlier or first tap connected to one input of NAND gate circuit 10-14 and by inverting the pulse signal at the later or second tap applied to the other input of NAND gate circuit 10-14. The waveform WENBN is controlled by the falling edge or negative going transition of the input pulse A for the following reasons. It avoids making the overall delay of the delay line substantially longer which would make the overall timing tolerances larger because the tolerance on the input pulse width is less than the increase in tolerance due to increases in delay line length.

Figure 5:
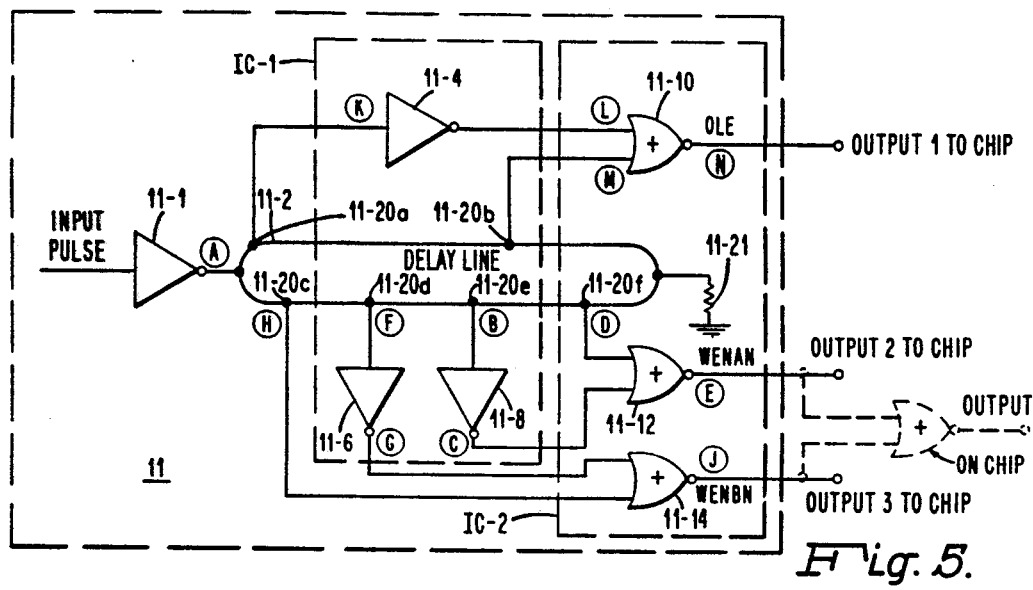
FIG. 5 is a circuit diagram of an alternate embodiment of the timing module of the present invention.
Figure 6:
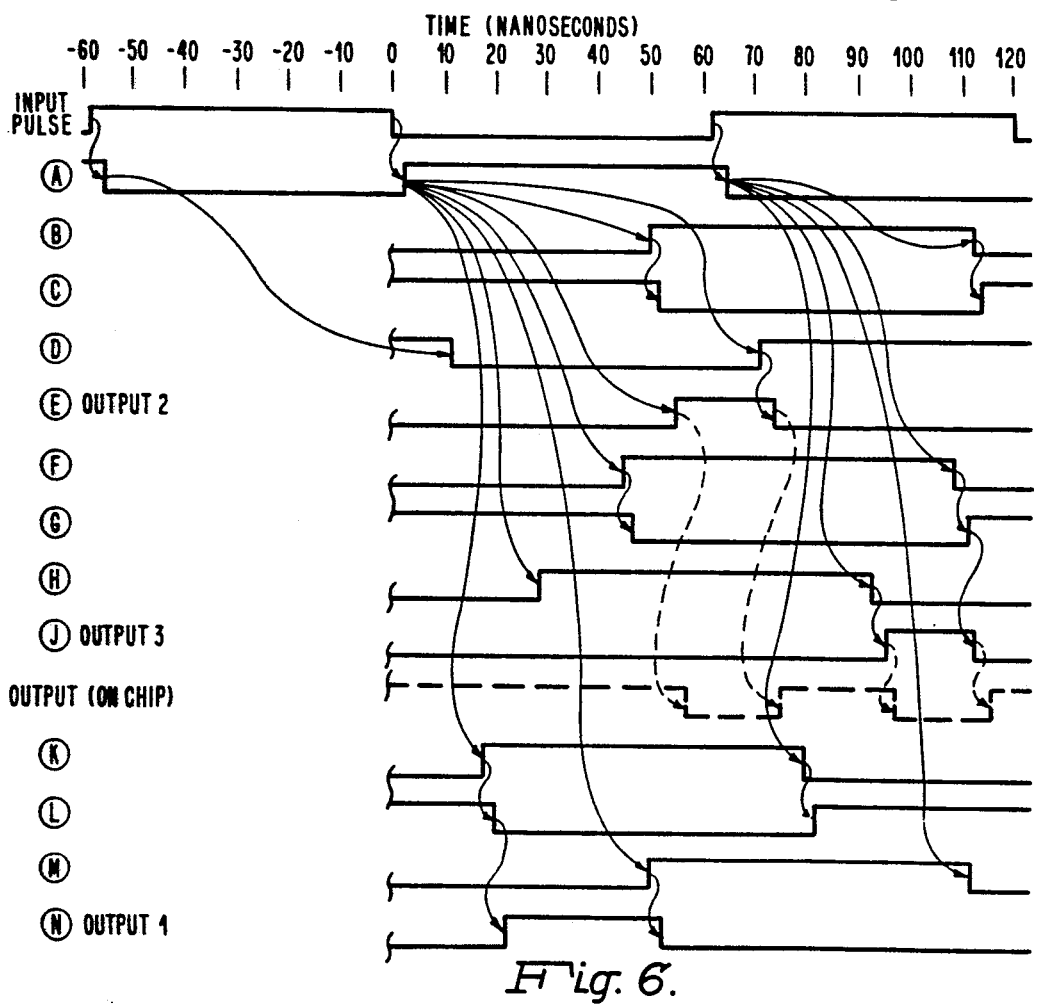
FIG. 6 is a timing diagram illustrating the generation of pulse sequences by the module of FIG. 5.

The shorter delay line is also more compact and easier to package. Also, the time separation between waveforms WENAN and WENBN increases in proportion to the cycle time since the duration of the input pulse is proportional to cycle time as previously mentioned. This separation relaxes the timing constraints on the components which are being controlled by the output pulses allowing them to take advantage of any increase in cycle time without having to make any changes to the timing module 10. This is illustrated by the dotted waveforms in FIG. 4. FIG. 5 is an alternate embodiment of the timing module of the present invention which utilizes inverter and NOR gate circuits. The waveforms generated by the module are shown in FIG. 6. While both inverter and NOR gates circuits are shown, NOR gate circuits can be used in place of the inverter circuits.

The above has shown how a timing module can be implemented with a single active delay line circuit to provide transitions with minimum tolerances and minimum relative tolerances between output pulse signals. The relative timing control provides good correlation between paths and accurate timing control of time intervals. The module can be packaged in a single DIP package and provides greater speed from more accurately controlled output pulses. Additionally, timing tolerances in the logic gate circuits can be compensated for by adjustments in tap delays.

The use of combinatorial logic circuits has the advantage of preventing changes in the states of the sequence of output pulses as a result of noise signals. This is in contrast to timing generator circuits constructed from bistable circuits whose states can be permanently changed by noise signals.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A timing module for use in a data processing unit for generating accurately timed sequence of pulses in response to each input pulse applied externally to said module during a system cycle of operation, said module comprising:

delay line including a plurality of interleaved pairs of taps corresponding in number to the number of pulses in said timed sequence, said delay line being customized so that first and second ones of each pair of taps provides output pulses produced by delaying an input pulse by increased amounts of delay which are different from other ones of said plurality of pairs and which include delays inherent in circuit means connected to said pairs of taps;

input gating circuit means for complementing said input pulse and applying said complemented input pulse to one end of said delay line to produce said output pulses;

a plurality of delay correlated inverting circuit means corresponding in number to said number of pulses, each of said plurality of inverting circuit means being connected to a predetermined tap of one of each pair of said plurality of pairs of interleaved taps; and, a plurality of delay correlated gating circuit means corresponding in number to said number of pulses, each of said plurality of gating means being connected to another tap of said one pair of said plurality of pairs of taps and to a corresponding one of said inverting circuit means, said each of said plurality of gating means logically combining each output pulse appearing at said one of said pair of taps with each inverted pulse from said corresponding one of said one of said inverting circuit means so as to generate a predetermined one of said timed sequence of pulses within said system cycle, said predetermined one of said pulses having transitions accurately controlled by a selected edge of said input pulse and a width defined by a predetermined relationship between output pulses produced by said different amounts of delay of said input pulse present at a corresponding one of said plurality of interleaved pairs of taps.

2. The timing module of claim 1 wherein said predetermined relationship between said different amounts of delay of said output pulse of said corresponding one of said pair of taps is that said width is equal to the difference in delay between said output pulses.

3. The timing module of claim 2 wherein said transitions of first and second ones of said sequence of pulses are controlled by one transition of said input pulse by having a corresponding ones of said inverting circuit means connected to said first tap of first and second pairs of interleaved taps and wherein said transitions of a last pulse of said sequences is controlled by another transition of said input pulse by having a corresponding one of said inverting means connected to said second tap of a last pair of interleaved pairs of taps.

4. The timing module of claim 3 wherein said one transition corresponds to a leading edge of said input pulse and said another transition of said input pulse corresponds to a trailing edge of said input pulse.

5. The timing module of claim 4 wherein said input gating circuit means, each of said inverting circuit means and each of said plurality of gating circuit means consists of a NAND gate circuit.

6. The timing module of claim 5 wherein said input pulse is a positive pulse having a width corresponding to a predetermined portion of said system cycle during which each sequence of said pulses occur so as to allow time separation between said second and said last ones of said pulses increase in proportion to said system cycle.

7. The timing module of claim 4 wherein said input gating circuit means and each of said inverting circuit means consists of an inverter circuit and wherein each of said plurality of gating circuit means consists of a NOR gate circuit.

8. The timing module of claim 7 wherein said input pulse is a negative going pulse having a width corresponding to a predetermined portion of said system cycle during which each sequence of said pulses occur.

9. A method of constructing a timing generator module for use in a data processing unit from an active delay line circuit to generate accurately timed sequences of output pulses at a corresponding number of outputs in response to externally applied input pulses within corresponding cycles of operation, said active delay line circuit including an input inverter circuit which connects to a single delay line having a plurality of output taps and a corresponding number of output inverter circuits connected to said plurality of output taps, said method comprising the steps of:

(a) connecting said input inverter circuit directly to the input of said delay line for applying the complements of said input pulses to said delay line;

(b) customizing said delay line by adjusting said delay line for providing at each output tap, a different fixed delay of each input pulse applied to said input inverter circuit which allows for the delays of said input inverter circuit and circuits in the active delay line circuit connected to each of said number of outputs;

(c) connecting one of said number of delay correlated output inverter circuits only to a predetermined one of a pair of output taps which are interleaved relative to other pairs of output taps, said output inverter circuit inverting, a predetermined one of each pair of pulses appearing at said each pair of output taps so that said pulses have a predetermined relationship to each other; and, (d) connecting a plurality of delay correlated combinatorial logic circuits to the other taps of said interleaved pairs of output taps in place of the output inverter circuits and to the outputs of said output inverter circuits connected to said predetermined ones of said pairs of output taps, each combinatorial logic circuit for logically combining said pair of pulses appearing at said interleaved pair of said output taps following the inversion in step (c) so as to generate one of said timed sequences of output pulses in response to each one of said input pulses, each output pulse having transitions accurately controlled by one of the edges of said input pulse selected in a predetermined manner and whose width is controlled by the fixed delay between a corresponding pair of said number of interleaved pairs of taps.

10. The method of claim 9 wherein the predetermined relationship is that each of said pair of pulses is delayed by said different fixed delay selected so that the difference between the fixed delays of said pair of pulses at said pair of output taps defines the width of the corresponding output pulse produced in step (d).

11. The method of claim 9 wherein the transitions of a plurality of output pulses of each one of said timed sequences of output pulses are controlled by a predetermined transition of a corresponding one of said input pulses.

12. The method of claim 11 wherein first and second ones of said each one of said timed sequences of said output pulses are controlled by said predetermined transition corresponding to a positive going transition or leading edge of said corresponding one of said input pulses.

13. The method of claim 12 wherein a last one of said each timed sequences of said output pulses is controlled by said predetermined transition corresponding to a negative going transition or trailing edge of said corresponding one of said input pulses.

14. The method of claim 9 wherein steps (a) and (d) includes using the same type of logic gate circuits and wherein said method further includes the step off housing said active delay line circuit within a single DIP package.

15. The method of claim 14 wherein said same type of logic gate circuits are NAND circuits.

16. The method of claim 15 wherein step (b) further includes adjusting said fixed delay of said delay line so as to compensate for differences in tolerances of said NAND circuits.

17. A timing module for use in a data processing unit for generating accurately timed sequence of pulses in response to each input pulse applied externally to said module during a system cycle of operation, said module comprising:

delay line including a plurality of interleaved pairs of taps corresponding in number to the number of pulses in said timed sequence, said delay line being customized so that first and second ones of each pairs of taps provides output pulses produced by delaying an input pulse by increased amounts of delay which are different from other ones of said plurality of pairs;

input gating circuit means for complementing said input pulse and applying said complemented input pulse to one end of said delay line to produce said output pulses, a first integrated circuit within said module comprising a plurality of inverting circuit means corresponding in number to said number of pulses, each of said plurality of inverting circuit means being connected to a predetermined tap of one of each pair of said plurality of pairs of interleaved taps; and, a second integrated circuit within said module comprising a plurality of gating circuit means corresponding in number to said number of pulses, each of said plurality of gating means being connected to another tap of said one pair of said plurality of pairs of taps and to a corresponding one of said inverting circuit means, said each of said plurality of gating means logically combining each output pulse appearing at said one of said pair of taps with each inverted pulse from said corresponding one of said one of said inverting circuit means so as to generate a predetermined one of said timed sequence of pulses within said system cycle, said predetermined one of said pulses having transitions accurately controlled by a selected edge of said input pulse and a width defined by a predetermined relationship between output pulses produced by said different amounts of delay of said input pulse present at a corresponding one of said plurality of interleaved pairs of taps and said delay line and said input gating means, said plurality of inverting circuit means and said plurality of gating circuit means being housed within a single DIP package.

* * * * *